United States Patent
Janneck et al.

(10) Patent No.: US 8,402,409 B1
(45) Date of Patent: Mar. 19, 2013

(54) METHOD AND APPARATUS FOR SUPPORTING RUN-TIME RECONFIGURATION IN A PROGRAMMABLE LOGIC INTEGRATED CIRCUIT

(75) Inventors: Jorn W. Janneck, San Jose, CA (US);
David B. Parlour, Fox Chapel, PA (US);
Paul R. Schumacher, Berthoud, CO (US)

(73) Assignee: Xilinx, Inc., San Jose, CA (US)

( * ) Notice: Subject to any disclaimer, the term of this patent is extended or adjusted under 35 U.S.C. 154(b) by 803 days.

(21) Appl. No.: 11/373,744

(22) Filed: Mar. 10, 2006

(51) Int. Cl.
*G06F 17/50* (2006.01)
*G06F 9/45* (2006.01)

(52) U.S. Cl. ........ 716/117; 716/103; 716/104; 716/106; 716/110; 716/116; 716/138; 716/139; 717/136; 717/137

(58) Field of Classification Search .............. 716/16–18; 717/136–137
See application file for complete search history.

(56) References Cited

U.S. PATENT DOCUMENTS

| | | | |
|---|---|---|---|
| 4,758,953 A | 7/1988 | Morita et al. | |
| 5,095,441 A | 3/1992 | Hopper et al. | |
| 5,249,133 A | 9/1993 | Batra | |
| 5,452,239 A | 9/1995 | Dai et al. | |
| 5,553,272 A | 9/1996 | Ranganathan et al. | |
| 5,870,588 A | 2/1999 | Rompaey et al. | |
| 5,896,301 A | 4/1999 | Barrientos | |
| 5,898,595 A | 4/1999 | Bair et al. | |
| 5,910,899 A | 6/1999 | Barrientos | |
| 6,011,911 A | 1/2000 | Ho et al. | |
| 6,023,567 A | 2/2000 | Osier et al. | |
| 6,078,736 A * | 6/2000 | Guccione | 716/16 |
| 6,131,080 A | 10/2000 | Raimi et al. | |
| 6,135,647 A | 10/2000 | Balakrishnan et al. | |
| 6,154,719 A | 11/2000 | Saitoh et al. | |
| 6,216,258 B1 * | 4/2001 | Mohan et al. | 716/17 |
| 6,230,299 B1 | 5/2001 | McSherry et al. | |
| 6,230,307 B1 * | 5/2001 | Davis et al. | 716/16 |
| 6,237,007 B1 | 5/2001 | Brown | |
| 6,272,671 B1 | 8/2001 | Fakhry | |
| 6,292,925 B1 * | 9/2001 | Dellinger et al. | 716/113 |
| 6,298,472 B1 | 10/2001 | Phillips et al. | |
| 6,467,075 B1 * | 10/2002 | Sato et al. | 716/103 |
| 6,487,709 B1 * | 11/2002 | Keller et al. | 716/14 |
| 6,530,071 B1 * | 3/2003 | Guccione et al. | 716/17 |

(Continued)

OTHER PUBLICATIONS

J. Eker and J.W. Jannecki "CAL Language Report—Specification of the CAL actor Language", Version 1.0, document edition 1; ERL Technical Memo UCB/ERL, M03/48; University of California at Berkeley; Dec. 1, 2003; pp. 1-112.

(Continued)

*Primary Examiner* — Helen Rossoshek
(74) *Attorney, Agent, or Firm* — Robert M. Brush; Kevin T. Cuenot; LeRoy D. Maunu

(57) ABSTRACT

Method and apparatus for generating an implementation of a program language circuit description for a programmable logic device (PLD) is described. In one example, the program language circuit description is analyzed to identify constructs indicative of dynamic function re-assignment. A hardware description of the program language circuit description is generated. The hardware description includes a plurality of implementations responsive to the identified constructs. Physical implementation data is generated from the hardware description. The physical implementation includes a plurality of partial configurations for the PLD based on the respective plurality of implementations in the hardware description.

17 Claims, 5 Drawing Sheets

U.S. PATENT DOCUMENTS

| | | | |
|---|---|---|---|
| 6,530,072 B1 | 3/2003 | Hagerman et al. | |
| 6,546,532 B1 | 4/2003 | Kerzman et al. | |
| 6,557,156 B1* | 4/2003 | Guccione | 716/17 |
| 6,622,291 B1 | 9/2003 | Ginetti | |
| 6,678,646 B1* | 1/2004 | McConnell et al. | 703/22 |
| 6,691,301 B2* | 2/2004 | Bowen | 717/114 |
| 6,725,441 B1* | 4/2004 | Keller et al. | 716/16 |
| 6,756,922 B2 | 6/2004 | Ossia | |
| 6,829,753 B2 | 12/2004 | Lee et al. | |
| 6,857,110 B1* | 2/2005 | Rupp et al. | 716/4 |
| 6,865,726 B1 | 3/2005 | Igusa et al. | |
| 6,868,017 B2 | 3/2005 | Ikeda | |
| 6,868,532 B2 | 3/2005 | Nadeau-Dostie et al. | |
| 6,912,706 B1* | 6/2005 | Stamm et al. | 716/17 |
| 6,922,665 B1* | 7/2005 | Guccione et al. | 703/14 |
| 6,957,423 B1* | 10/2005 | Ma | 717/137 |
| 6,988,238 B1 | 1/2006 | Kovacevic et al. | |
| 6,993,733 B2 | 1/2006 | Murphy | |
| 7,003,751 B1 | 2/2006 | Stroomer et al. | |
| 7,006,960 B2 | 2/2006 | Schaumont et al. | |
| 7,007,264 B1* | 2/2006 | Baxter | 716/103 |
| 7,024,654 B2* | 4/2006 | Bersch et al. | 716/16 |
| 7,062,418 B2 | 6/2006 | Lee et al. | |
| 7,073,152 B2 | 7/2006 | Keller et al. | |
| 7,073,158 B2* | 7/2006 | McCubbrey | 716/17 |
| 7,139,955 B2 | 11/2006 | Rohrbaugh et al. | |
| 7,139,995 B1* | 11/2006 | James-Roxby et al. | 716/16 |
| 7,143,367 B2 | 11/2006 | Eng | |
| 7,143,418 B1* | 11/2006 | Patterson | 719/328 |
| 7,146,300 B2 | 12/2006 | Zammit et al. | |
| 7,146,583 B1 | 12/2006 | Sun et al. | |
| 7,194,705 B1 | 3/2007 | Deepak et al. | |
| 7,194,714 B2 | 3/2007 | Kartschoke et al. | |
| 7,203,632 B2 | 4/2007 | Milne et al. | |
| 7,216,321 B2 | 5/2007 | Murphy et al. | |
| 7,240,303 B1* | 7/2007 | Schubert et al. | 716/4 |
| 7,243,330 B1* | 7/2007 | Ganesan et al. | 716/18 |
| 7,315,991 B1 | 1/2008 | Bennett | |
| 7,337,422 B1* | 2/2008 | Becker et al. | 716/16 |
| 7,343,594 B1* | 3/2008 | Metzgen | 717/140 |
| 7,437,692 B2* | 10/2008 | Oberlaender | 716/4 |
| 7,480,606 B2* | 1/2009 | Tseng et al. | 703/14 |
| 7,895,584 B1* | 2/2011 | Ma et al. | 717/144 |
| 2001/0007139 A1 | 7/2001 | Murray | |
| 2002/0049958 A1 | 4/2002 | Shimazawa | |
| 2002/0059054 A1 | 5/2002 | Bade et al. | |
| 2003/0046671 A1* | 3/2003 | Bowen | 717/141 |
| 2003/0084416 A1 | 5/2003 | Dai et al. | |
| 2003/0121010 A1* | 6/2003 | Aubury | 716/4 |
| 2003/0216901 A1 | 11/2003 | Schaumont et al. | |
| 2003/0229877 A1* | 12/2003 | Bersch et al. | 716/16 |
| 2004/0015613 A1 | 1/2004 | Ikeda | |
| 2004/0025122 A1* | 2/2004 | Schubert et al. | 716/4 |
| 2004/0040005 A1* | 2/2004 | Carison | 716/8 |
| 2004/0060032 A1* | 3/2004 | McCubbrey | 716/16 |
| 2004/0123258 A1* | 6/2004 | Butts | 716/5 |
| 2004/0141354 A1 | 7/2004 | Carnahan | |
| 2005/0063481 A1 | 3/2005 | Fechtel et al. | |
| 2005/0188339 A1 | 8/2005 | Anderson | |
| 2005/0210383 A1 | 9/2005 | Cucerzan et al. | |
| 2005/0268258 A1 | 12/2005 | Decker | |
| 2005/0268260 A1 | 12/2005 | Suaya et al. | |
| 2006/0059134 A1 | 3/2006 | Palmon et al. | |
| 2006/0090146 A1 | 4/2006 | LeBritton et al. | |
| 2006/0136193 A1 | 6/2006 | Lux-Pogodalla et al. | |
| 2006/0190904 A1* | 8/2006 | Haji-Aghajani et al. | 716/17 |
| 2006/0200788 A1 | 9/2006 | Nation et al. | |
| 2006/0206850 A1* | 9/2006 | McCubbrey | 716/17 |
| 2007/0283311 A1* | 12/2007 | Karoubalis et al. | 716/16 |
| 2008/0071514 A1* | 3/2008 | Yuri | 703/15 |
| 2008/0077906 A1* | 3/2008 | Bowyer et al. | 716/18 |
| 2008/0263486 A1* | 10/2008 | Alexanian et al. | 716/5 |
| 2009/0132979 A1* | 5/2009 | Waters et al. | 716/5 |
| 2009/0144690 A1* | 6/2009 | Spackman et al. | 716/18 |

OTHER PUBLICATIONS

Massimo Ravasi et al.; "High-Level Algorithmic Complexity Evaluation for System Design"; Journal of Systems Architecture; Feb. 2003; Copyright 2003 Elsevier Science B.V.; available at www.ComputerScienceWeb.com; pp. 403-427.

Xilinx, Inc.; "Two Flows for Partial Reconfiguration: Module Based or Difference Based"; XAPP290 (v1.2); Sep. 9, 2004; available from www.xilinx.com; pp. 1-28.

Xilinx, Inc.; U.S. Appl. No. 11/373,745 by Janneck et al. filed Mar. 10, 2006.

Xilinx, Inc.; U.S. Appl. No. 11/373,709 by Schumacher et al. filed Mar. 10, 2006.

Xilinx, Inc.; U.S. Appl. No. 11/243,679 by Janneck et al. filed Oct. 4, 2005.

Xilinx, Inc.; U.S. Appl. No. 11/243,732 by Vogenthaler filed Oct. 4, 2005.

Gilleland, Michael, "Levenshtein Distance, in Three Flavors," pp. 1-12, available from ttp://www.merriampark.com/ld.htm.

Hsu, Chia-Jui et al.; "DIF: An Interchange Format for Dataflow-based Design Tools," International Workshop on Systems, Architectures, Modeling and Simulation, Jul. 2004, pp. 1-10, available from Department of Electrical and Computer Engineering and Institute for Advanced Computer Studies, University of Maryland, College Park, 20742.

Lee, Edward A. et al.; "Dataflow Process Networks," Proceedings of the IEEE, May 1995, pp. 773-799, vol. 83, No. 5, available from IEEE, 3 Park Avenue, 17th Floor, New York, NY 10016-5997.

Bhattacharyya, Shuvra Shikhar, "Compiling Dataflow Programs for Digital Signal Processing," Jul. 1994, pp. 1-255, available from Department of Electrical Engineering and Computer Sciences, University of California at Berkeley, Berkeley, CA 94720.

Tanaka, Eiichi et al., "High Speed String Edit Methods Using Hierarchical Files and Hashing Technique," Nov. 14-17, pp. 334-336, 1988 Pattern Recognition; 9th International Conference; vol. 1; Copyright 1988 IEEE.

Navarro, Gonzalo, "Pattern Matching," Department of Computer Science, University of Chile, Mar. 7, 2005, pp. 1-24, available from the Internet at http://www.ciw.cl/publicaciones/jstat04.pdf.

U.S. Appl. No. 11/083,667, filed Mar. 18, 2005, Milne et al.

Tolujev, Juri et al., "Assessment of Simulation Models Based on Trace-File Analysis: A Metamodeling Approach," *Proc. of the 1998 Winter Simulation Conference*, Dec. 13-16, 1998, Washington, DC, USA.

Damani, OM P. et al., "Optimistic Distributed Simulation Based on Transitive Dependency Tracking," *ACM SIGSIM Simulation Digest*, Jul. 1997, vol. 27, Issue 1, pp. 90-97.

\* cited by examiner

METHOD AND APPARATUS FOR SUPPORTING RUN-TIME RECONFIGURATION IN A PROGRAMMABLE LOGIC INTEGRATED CIRCUIT

FIELD OF THE INVENTION

One or more aspects of the present invention relate generally to electronic circuit design and analysis systems and, more particularly, to a method and apparatus for supporting run-time reconfiguration in a programmable logic device (PLD).

BACKGROUND OF THE INVENTION

Modern integrated circuits are designed using programmed computers. Such computers are conventionally programmed with Electronic Design Automation (EDA) and Electronic Computer-Aided Design (ECAD) tools (generally referred to as EDA tools). EDA tools process an abstract representation of a circuit design into a physical representation of the circuit design that can be implemented using integrated circuitry. For example, a circuit design may be specified by a designer using a hardware description language (HDL), such as the very high speed integrated circuit hardware description language (VHDL) or VERILOG.

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. An FPGA may also include various dedicated logic circuits, such as memories, digital clock managers (DCMs), and input/output (I/O) transceivers. Notably, an FPGA may include one or more embedded processors. The programmable logic of an FPGA (e.g., CLBs, IOBs, and interconnect structure) is typically programmed by loading a stream of configuration data (known as a bitstream) into internal configuration memory cells. The states of the configuration memory cells define how the CLBs, IOBs, interconnect structure, and other programmable logic are configured. Some FPGAs include support for run-time partial reconfiguration, which provides the ability to alter the behavior of portions of a circuit configured in an active FPGA. Partial reconfiguration is useful in systems that must support a wide range of optional behavior, only a subset of which is operational at any point in time.

Typically, circuits are designed for implementation in an FPGA using an HDL. However, present HDLs are only capable of describing a circuit that is static, that is, a circuit whose function is fully described at design time. Thus, in present design flows, it is very challenging to model dynamic circuits that use run-time reconfiguration. Accordingly, there exists a need in the art for modeling, analysis, and implementation of a circuit designed to use run-time reconfiguration capabilities of a PLD.

SUMMARY OF THE INVENTION

Method and apparatus for generating an implementation of a program language circuit description for a programmable logic device (PLD) is described. In one embodiment, the program language circuit description is analyzed to identify constructs indicative of dynamic function re-assignment. A hardware description of the program language circuit description is generated. The hardware description includes a plurality of implementations responsive to the identified constructs. Physical implementation data is generated from the hardware description. The physical implementation includes a plurality of partial configurations for the PLD based on the respective plurality of implementations in the hardware description.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for generating a run-time reconfigurable implementation of a circuit description for a programmable logic device (PLD) is described. A high-level programming language model is provided for describing systems that employ run-time reconfiguration. The high-level model is used to capture a complete description of a system, including all alternative behaviors that can be selected at runtime, and the control mechanisms for selecting the appropriate behaviors. A circuit description generated in this manner is a homogenous, self-contained model of an entire reconfigurable system.

Physical PLD implementations are generated automatically from the circuit description in the form of a full configuration and multiple partial configurations. Since the model is complete, implementations for all alternative behaviors selectable at runtime are generated, along with an implementation of the static portion of the design. The static portion includes the control logic that manages multiple partial configurations for the alternative behaviors and controls the loading and unloading of these partial configurations at runtime. An aspect of the invention is described with respect to a field programmable gate array (FPGA). It is to be understood that the invention may be used with other types of PLDs that are capable of runtime reconfiguration.

Figure 1:
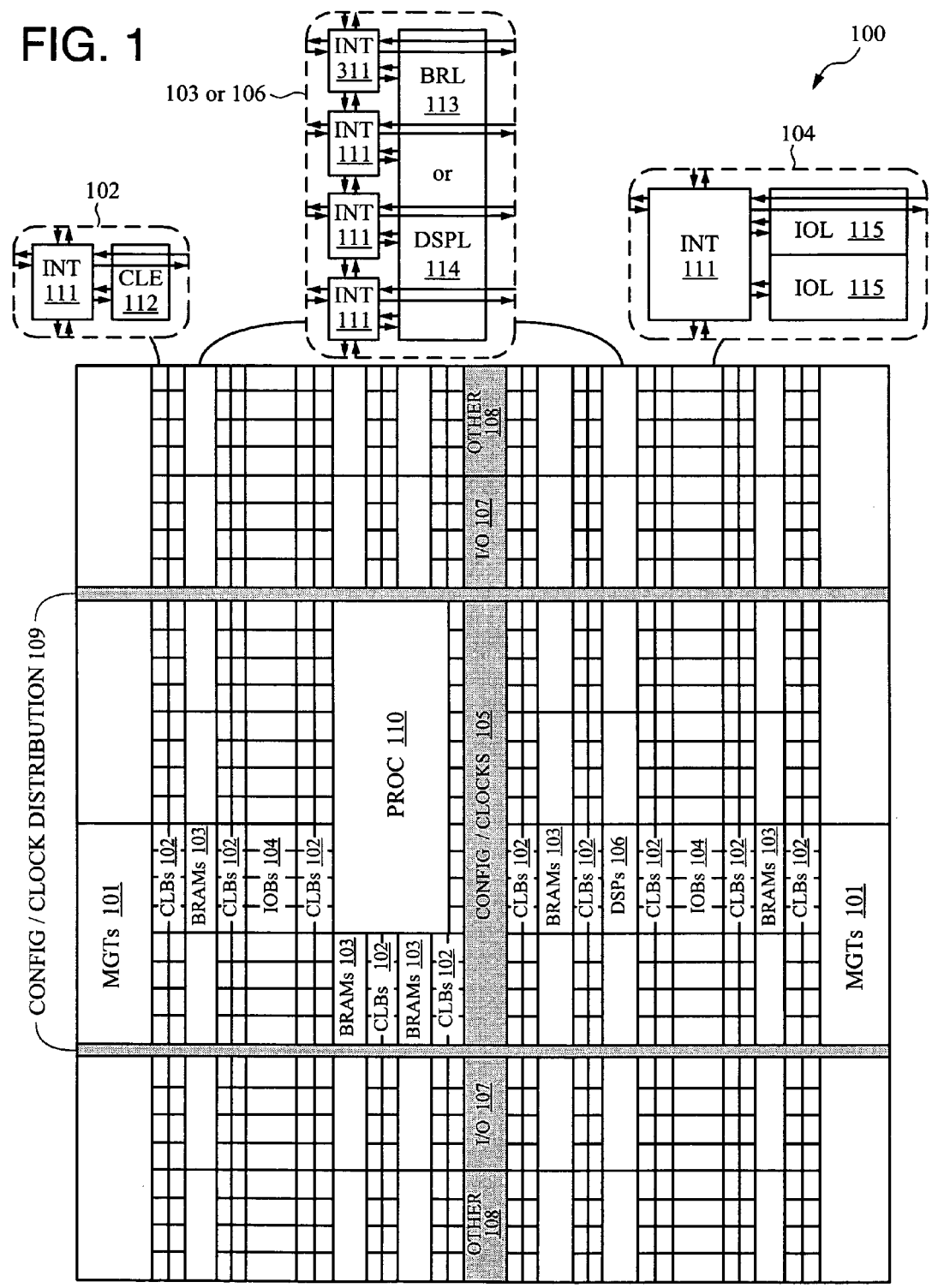
FIG. 1 illustrates an exemplary embodiment of an FPGA architecture.

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, an ARM processor, or like type processor core known in the art. The processor block 110 is coupled to the programmable logic of the FPGA in a well known manner.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Configuration information for the programmable logic is stored in configuration memory (not shown). The configuration logic 105 provides an interface to, and loads configuration data to, the configuration memory. A stream of configuration data ("configuration bitstream") may be coupled to the configuration logic 105, which in turn loads the configuration memory. Notably, the configuration logic 105 is configured to support the loading of partial configuration bitstreams while the FPGA is active. This allows for reconfiguration of portions of the FPGA during runtime. The configuration and reconfiguration process for the FPGA is well known in the art.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
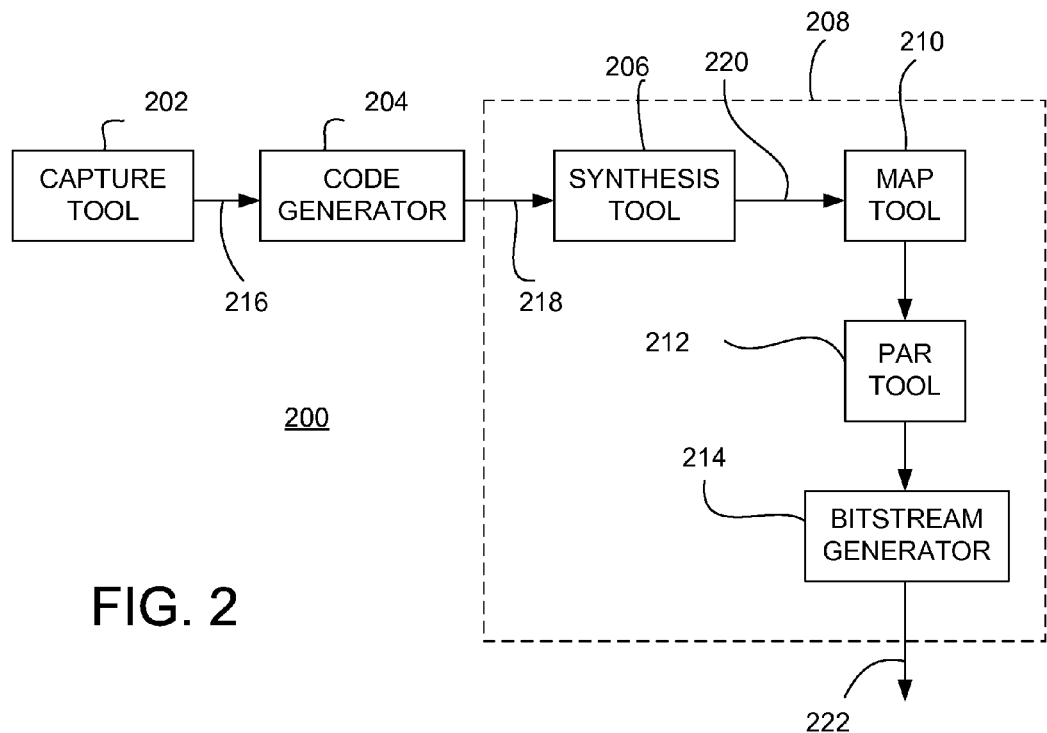
FIG. 2 is a block diagram depicting an exemplary embodiment of a system for generating a run-time reconfigurable implementation of a circuit description for a programmable logic device (PLD) in accordance with one or more aspects of the invention.

FIG. 2 is a block diagram depicting an exemplary embodiment of a system 200 for generating a run-time reconfigurable implementation of a circuit description for a programmable logic device (PLD) in accordance with one or more aspects of the invention. The system 200 includes a capture tool 202, a code generator 204, and an implementation tool 208. In one embodiment, the implementation tool 208 includes a synthesis tool 206, a map tool 210, a place and route (PAR) tool 212, and a bitstream generator 214. The system 200 is configured to capture a circuit design from user input using a high-level programming language model and produce a re-configurable implementation for a target FPGA. An exemplary re-configurable implementation is shown below with respect to FIG. 5.

In particular, the capture tool 202 generates the program language description 216 of a circuit from user input. The capture tool 202 may be a graphical user interface (GUI) or other type of interface known in the art in which a designer may interact to specify the program language description 216. The program language description 216 includes programming constructs that define a particular system, which may be hardware or a combination of hardware and software. The program language description 216 may be specified using a sequential programming language, such as C or C++, or a concurrent programming language, such as the CAL actor programming language or SystemC. Notably, such high-level programming languages include constructs that allow for changing the behavior of functions or procedures at runtime (i.e., dynamic function assignment). Examples of such constructs include function pointers in C, virtual functions in C++, and function/procedure closures in CAL. As used herein, the term "function" is meant to include procedures. Using these constructs, a function may have its behavior dynamically re-assigned during runtime. Dynamic function re-assignments may be used to model reconfiguration of a circuit during runtime. For example, in C, re-assigning a function pointer to a new function (i.e., a change in behavior of the function pointer) models runtime reconfiguration in terms of hardware implementation.

The code generator 204 is configured to receive the program language description 216. The code generator 204 processes the program language description 216 to produce a hardware description 218 (e.g., an HDL description). The implementation tool 208 is configured to generate implementation data 222 from the hardware description 218. In particular, the synthesis tool 206 is configured to receive the hardware description 218 and generate a logical network list (netlist) 220 (also referred to as a gate-level netlist). The map tool 210 is configured to map the netlist onto primitives of the target FPGA (e.g., CLBs, IOBs, etc.). The PAR tool 212 is configured to place and route output of the map tool 210. The bitstream generator 214 is configured to generate the implementation data 222 from the output of the PAR tool 212. Operation of the code generator 204, the synthesis tool 206, and the implementation tool 208 with respect to generating a run-time reconfigurable implementation of the program language description 216 is described below.

Figure 3:
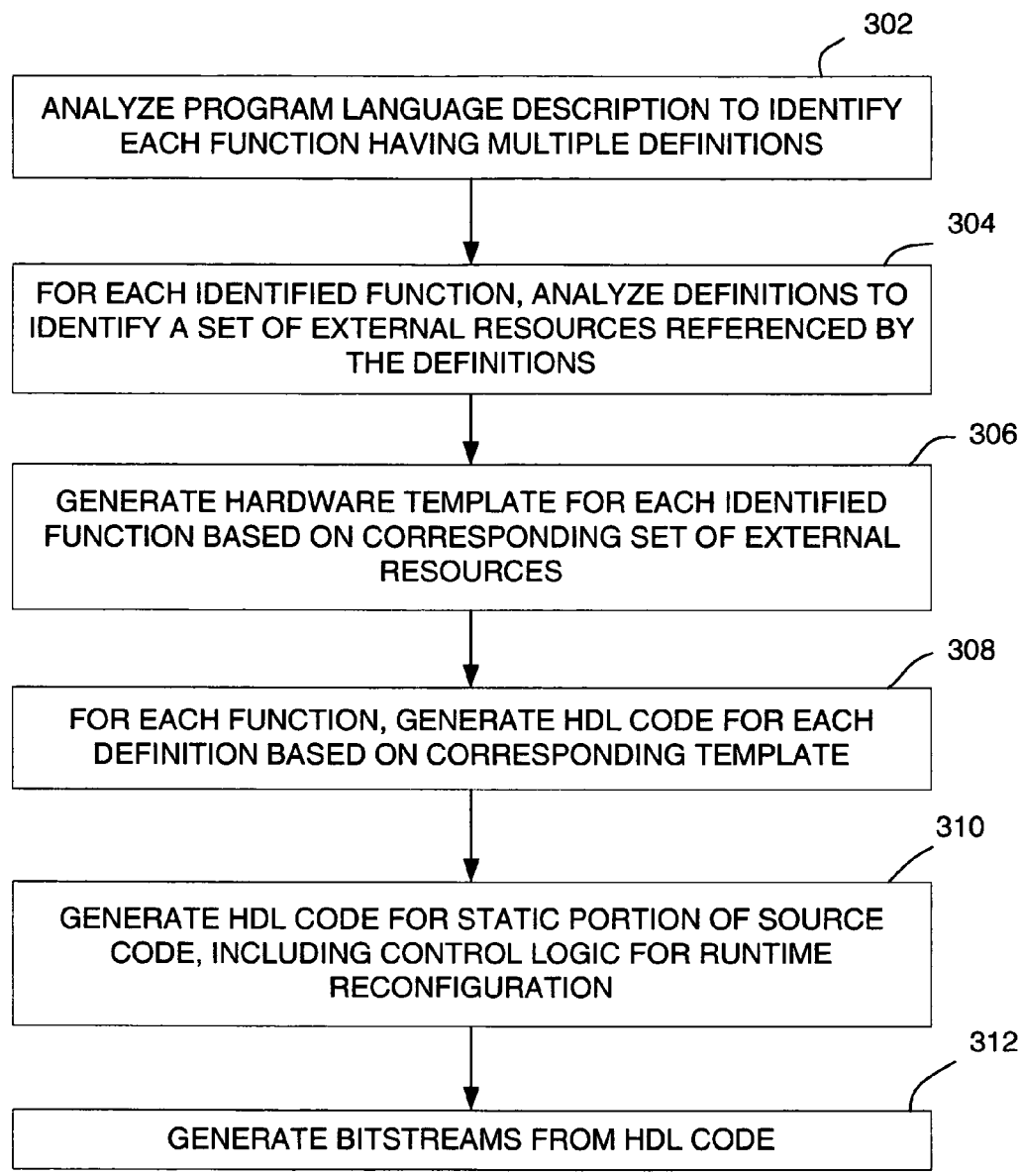
FIG. 3 is a flow diagram showing an exemplary embodiment of a method for implementing a program language description of a circuit in accordance with one or more aspects of the invention.

FIG. 3 is a flow diagram showing an exemplary embodiment of a method 300 for implementing the program language description 216 in accordance with one or more aspects of the invention. At step 302, the program language description 216 is analyzed to identify at least one function that is dynamically re-assigned. In the source code, the dynamic function re-assignment takes the form of a function taking on a plurality of definitions. For example, in C, a pointer to a function, which when de-referenced is a function, may have values corresponding to multiple function bodies assigned thereto and thus has multiple definitions.

At step 304, for each identified function, each of its possible definitions is analyzed to identify a set of external resources referenced in the bodies of the definitions. External resources may comprise, for example, variables having global scope with respect to the function. For example, assume x is a function pointer that initially points to a function func1( ), but is later re-assigned to point to a function func2( ). For the function pointer x, the definitions of func1( ) and func2( ) are analyzed to determine a set of external resources referenced therein. For example, the function func1( ) may reference an external variable E1, and the function func2( ) may reference two external variables E1 and E2. The set of external resources therefore includes the variables E1 and E2.

Figure 4:
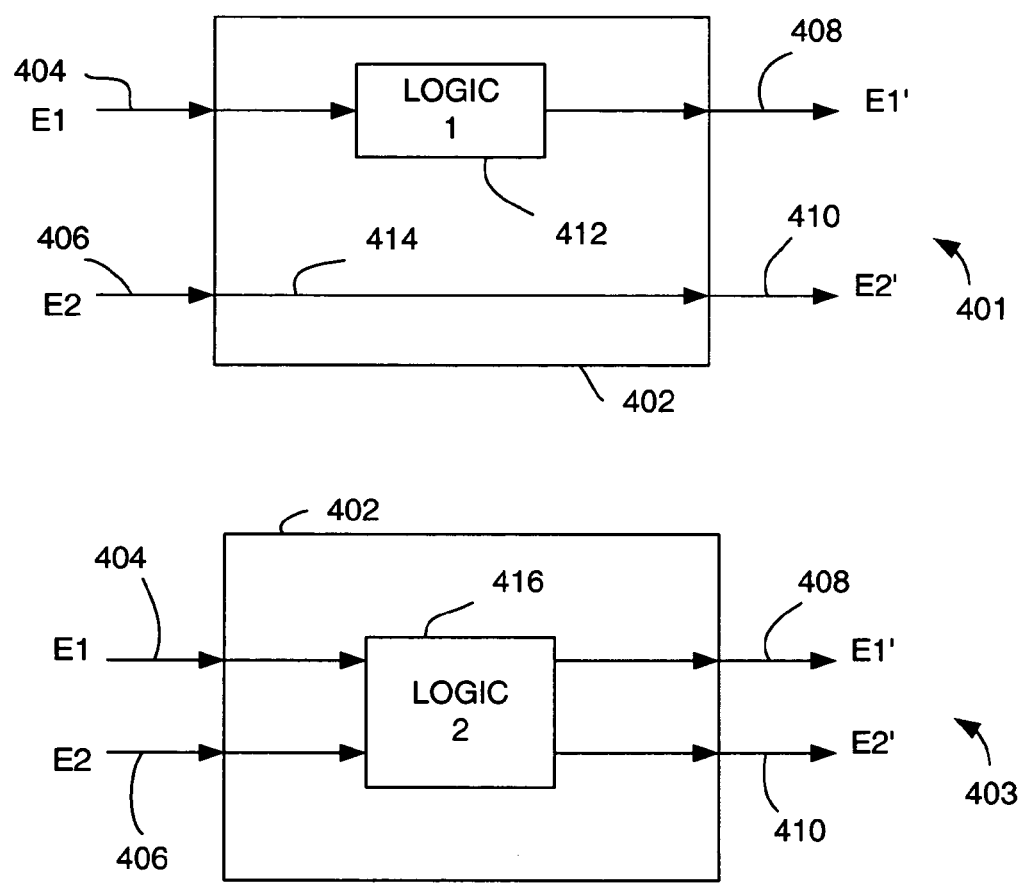
FIG. 4 is a block diagram depicting exemplary representations of hardware for two definitions of a given function.

At step 306, a hardware template is generated for each identified function based on the corresponding set of external resources. For a given function, the hardware template provides a template for a hardware implementation of each of the possible definitions. At step 308, for each function, an HDL code implementation is generated for each definition based on the corresponding template for the function. FIG. 4 is a block diagram depicting exemplary hardware representations 401 and 403 for two definitions of a given function. The representations 401 and 403 are hardware representations of the function pointer x having definitions func1( ) and func2( ), respectively. In the example above, func1( ) refers to external resource E1 and func2( ) refers to both external resources E1 and E2. Each of the hardware representations 401 and 403 are based on a template 402. The template 402 includes two input ports 404 and 406 configured to receive variables E1 and E2, respectively. The template 402 includes two output ports 408 and 410 configured to produce modified variables E1' and E2', respectively. The template 402 is configured to manage all of the variables in the set of external resources identified at step 304, regardless of whether the actual implemented definition uses the resources. Thus, in hardware representation 401 of func1( ), logic 412 only processes E1 from the input port 404. The E2 resource is fed through via path 414 without being processed. In the representation 403 of func2( ), logic 416 processes both E1 and E2 from the input ports 404 and 406, respectively.

Returning to FIG. 3, at step 310, an HDL code implementation is generated for the static portion of the program language description 216, including control logic for triggering runtime reconfiguration. As described below, each of the HDL code implementations produced at step 308 are used to generate partial bitstreams for the FPGA. In the physical implementation, each of the partial bitstreams is assigned a handle and is stored in a memory. In the static portion of the program language description 216, each of the constructs that implement dynamic function re-assignment is code-generated to pass a handle to the appropriate partial bitstream. Changing the behavior of a function in the source code translates to a control action in the hardware implementation that triggers runtime reconfiguration. The handles are used to determine which partial bitstream is to be used for the reconfiguration. The control logic is generated to manage reconfiguration in response to the generated control actions and specified handles. Steps 302 through 310 are performed by the code generator 204.

At step 312, bitstreams for the FPGA are generated from the HDL code. In particular, the HDL implementations for the function definitions are processed by the synthesis tool 206, the map tool 210, the PAR tool 212, and the bitstream generator 214 to produce partial bitstreams for runtime reconfiguration. For the HDL implementation of the static portion, the synthesis tool 206 recognizes each of the templates capable of multiple configurations and performs resource estimation for each of the templates accounting for all of the definitions. In essence, the synthesis tool 206 synthesizes the static portion with a "black box" for each of the templates. The black box for each template is configured to contain the largest definition in terms of resources. The synthesized static portion is then processed by the map tool 210, the PAR tool 212, and the bitstream generator 214 to produce a full bitstream for configuring the FPGA.

Figure 5:
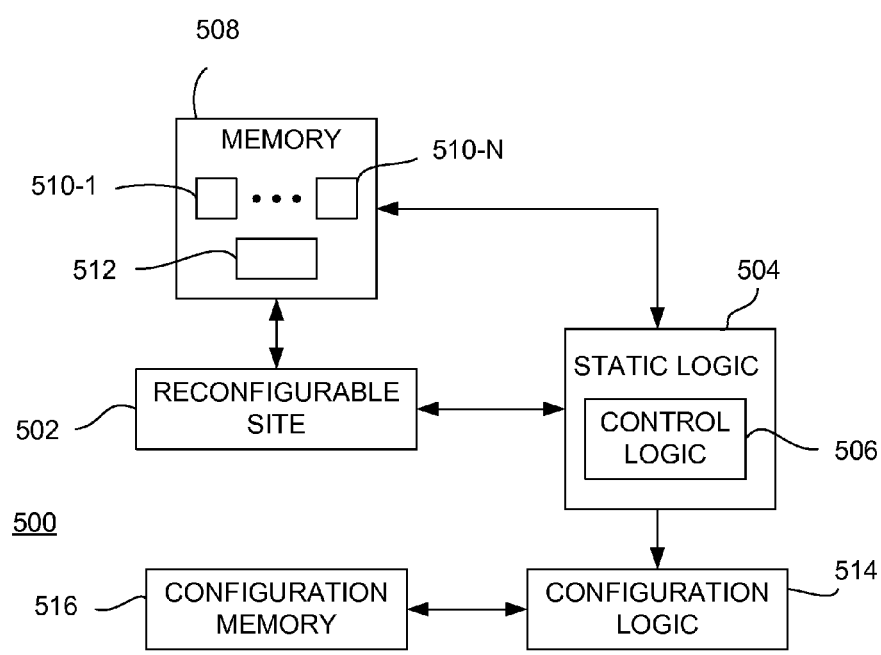
FIG. 5 is a block diagram depicting an exemplary embodiment of a physical implementation in accordance with one or more aspects of the invention.

FIG. 5 is a block diagram depicting an exemplary embodiment of a physical implementation 500 in accordance with one or more aspects of the invention. The physical implementation 500 includes a reconfigurable site 502, static logic 504, and memory 508. For purposes of clarity by example, only a single reconfigurable site is shown. It is to be understood that the physical implementation 500 may include multiple reconfigurable sites. The memory 508 is configured to store partial bitstreams 510-1 through 510-N (collectively referred to as partial bitstreams 510), where N is a positive integer. Each of the partial bitstreams 510 is adapted to configure a different circuit in the reconfigurable site 502 and is assigned a unique handle. The static logic 504 includes control logic 506. The control logic 506 is adapted to respond to triggers from the static logic 504 for runtime reconfiguration. The static logic 504 selects a particular partial bitstream using a predefined handle, as described above. The control logic 506 causes configuration logic 514 of the FPGA to load the required partial bitstream into configuration memory 516 of the FPGA in order to reconfigure the reconfigurable site 502. The static logic 504 and the logic of the reconfigurable site 502 are configured to access the memory 508 to read and write data 512.

Figure 6:
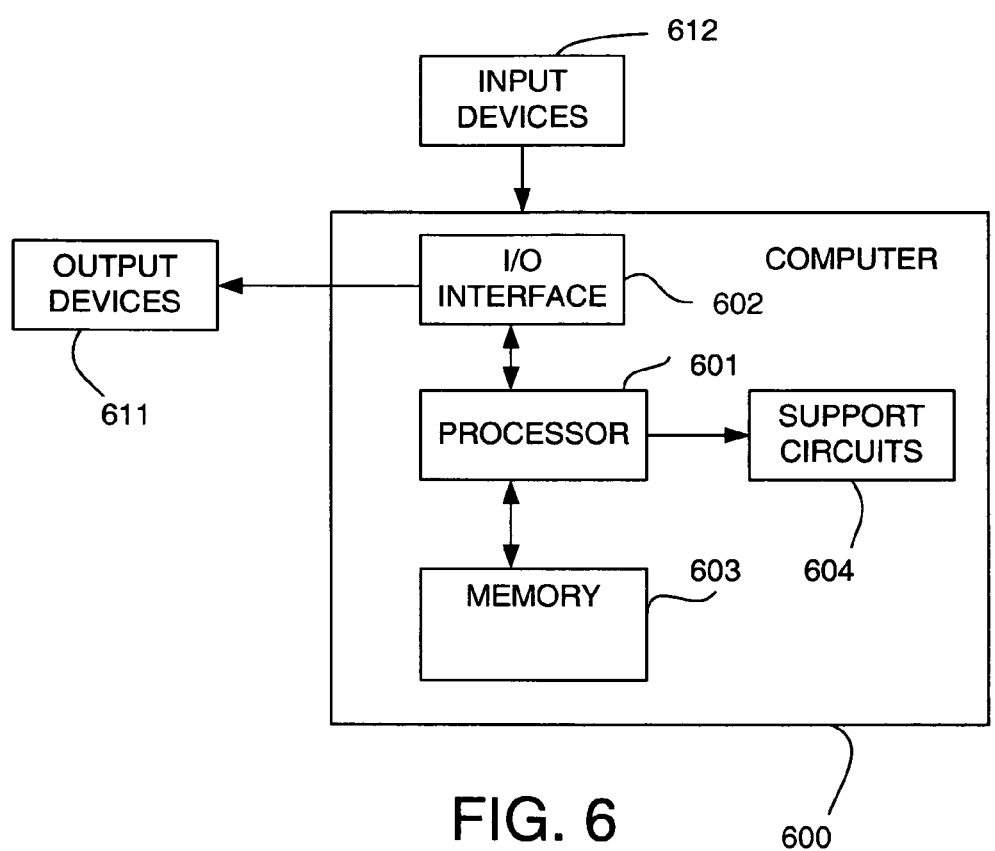
FIG. 6 is a block diagram depicting an exemplary embodiment of a computer suitable for implementing the processes and methods described herein.

FIG. 6 is a block diagram depicting an exemplary embodiment of a computer 600 suitable for implementing the processes and methods described herein. For example, the computer 600 may be used to implement the system 200 of FIG. 2 and the method 300 of FIG. 3. The computer 600 includes a processor 601, a memory 603, various support circuits 604, and an I/O interface 602. The processor 601 may be any type of microprocessor known in the art. The support circuits 604 for the processor 601 include conventional cache, power supplies, clock circuits, data registers, I/O interfaces, and the like. The I/O interface 602 may be directly coupled to the memory 603 or coupled through the processor 601. The I/O interface 602 may be coupled to various input devices 612 and output devices 611, such as a conventional keyboard, mouse, printer, display, and the like.

The memory 603 stores all or portions of one or more programs and/or data to implement the system 200 and method 300 described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 600 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 603. The memory 603 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of generating an implementation of a program language circuit description for a programmable logic integrated circuit (IC), comprising:
    on a computer processor, analyzing the program language circuit description, specified in a high-level programming language, to detect at least one function variable, each of the at least one function variable being assigned values corresponding to multiple function bodies, and each value references a different one of the multiple function bodies for dynamic function re-assignment;
    generating a hardware description of the program language circuit description, the hardware description being formatted in a hardware description language;
    wherein the step of generating the hardware description comprises:
        identifying a set of external variables that includes each external variable referenced by the multiple function bodies;
        generating, for each of the at least one function variable, a respective hardware template based on the set of external variables; and
        generating, for each of the multiple function bodies of the at least one function variable, a respective implementation based on the respective hardware template, each respective implementation having a respective port for each external variable referenced by the function body and a respective port for each external variable of the set of external variables not referenced by the function body;
    generating physical implementation data from the hardware description, the physical implementation data including a plurality of partial configurations for the programmable logic IC based on the respective implementations in the hardware description; and
    storing the physical implementation data in a memory;
    wherein the programmable logic IC, when loaded with the physical implementation data, is dynamically reconfigurable to implement selected partial configurations of the plurality of partial configurations responsive to a trigger within a static logic portion of the programmable logic IC.

2. The method of claim 1, wherein the hardware description further includes a description of control logic implemented within the programmable logic IC for managing runtime reconfiguration of the programmable logic IC using the plurality of partial configurations, and wherein the physical implementation data includes a physical implementation of the control logic.

3. The method of claim 1, wherein the step of generating the physical implementation data comprises:
    synthesizing the hardware description to produce netlist data; mapping the netlist data; and
    placing and routing the netlist data as mapped.

4. The method of claim 3, wherein the physical design data includes at least one full bitstream and a plurality of partial bitstreams respectively associated with the plurality of partial configurations.

5. The method of claim 1, wherein the programmable logic IC comprises a field programmable gate array (FPGA).

6. Apparatus for generating an implementation of a program language circuit description for a programmable logic integrated circuit (IC), comprising:
    a processor;
    a memory coupled to the processor, wherein the memory is configured with instructions that are executable by the processor for implementing a code generator and an implementation tool;
    the code generator for generating a hardware description of a program language circuit description, the hardware description being formatted in a hardware description language and including a plurality of implementations responsive to identified constructs;
    wherein the code generator, is configured to detect at least one function variable, each of the at least one function variable being assigned values corresponding to multiple function bodies, and each value references a different one of the multiple function bodies for dynamic function re-assignment; and
    wherein the code generator is configured to:
        identify a set of external variables that includes each external variable referenced by the multiple function bodies;
        generate, for each of the at least one function variable, a respective hardware template based on the set of external variables; and
        generate, for each of the multiple function bodies of the at least one function variable, a respective implementation of the plurality of implementations based on the respective hardware template, each respective implementation having a respective port for each external variable referenced by the function body and a respective port for each external variable of the set of external variables not referenced by the function body;

the implementation tool for generating physical implementation data from the hardware description, the physical implementation data including a plurality of partial configurations for the programmable logic IC based on the respective implementations in the hardware description, wherein the programmable logic IC, when loaded with the physical implementation data, is dynamically reconfigurable to implement selected partial configurations of the plurality of partial configurations responsive to a trigger within a static logic portion of the programmable logic IC.

7. The apparatus of claim 6, wherein the hardware description further includes a description of control logic implemented within the programmable logic IC for managing runtime reconfiguration of the programmable logic IC using the plurality of partial configurations, and wherein the physical implementation data includes a physical implementation of the control logic.

8. The apparatus of claim 6, wherein the implementation tool comprises:
a synthesizer for synthesizing the hardware description to produce netlist data; a map tool for mapping the netlist data; and
a place and route (PAR) tool for placing and routing the netlist data as mapped.

9. The apparatus of claim 8, wherein the implementation tool further comprises:
a bitstream generator for generating the physical implementation data from the netlist data as placed and routed.

10. The apparatus of claim 9, wherein the physical design data includes at least one full bitstream and a plurality of partial bitstreams respectively associated with the plurality of partial configurations.

11. The apparatus of claim 6, wherein the programmable logic IC comprises a field programmable gate array (FPGA).

12. The apparatus of claim 6, further comprising:
a capture tool for capturing the program language circuit description.

13. An article of manufacture, comprising:
a non-transitory computer readable medium having stored thereon software comprising a set of instructions, which when executed by a computer, performs a method for generating an implementation of a program language circuit description for a programmable logic integrated circuit (IC), comprising:
code for analyzing the program language circuit description, specified in a high-level programming language; P2 to detect at least one function variable, each of the at least one function variable being assigned values corresponding to multiple function bodies, and each value references a different one of the multiple function bodies for dynamic function re-assignment;
code for generating a hardware description of the program language circuit description, the hardware description being formatted in a hardware description language;
wherein the code for generating the hardware description includes code for:
identifying a set of external variables that includes each external variable referenced by the multiple function bodies;
generating, for each of the at least one function variable, a respective hardware template based on the set of external variables; and
generating, for each of the multiple function bodies of the at least one function variable, a respective implementation of the plurality of implementations based on the respective hardware template, each respective implementation having a respective port for each external variable referenced by the function body and a respective port for each external variable of the set of external variables not referenced by the function body; and
code for generating physical implementation data from the hardware description, the physical implementation data including a plurality of partial configurations for the programmable logic IC based on the respective implementations in the hardware description;
wherein the programmable logic IC, when loaded with the physical implementation data, is dynamically reconfigurable to implement selected partial configurations of the plurality of partial configurations responsive to a trigger within a static logic portion of the programmable logic IC.

14. The computer readable medium of claim 13, wherein the hardware description further includes a description of control logic implemented within the programmable logic IC for managing runtime reconfiguration of the programmable logic IC using the plurality of partial configurations, and wherein the physical implementation data includes a physical implementation of the control logic.

15. The computer readable medium of claim 13, wherein the code for generating the physical implementation data comprises:
code for synthesizing the hardware description to produce netlist data; code for mapping the netlist data; and
code for placing and routing the netlist data as mapped.

16. The computer readable medium of claim 15, wherein the physical design data includes at least one full bitstream and a plurality of partial bitstreams respectively associated with the plurality of partial configurations.

17. The computer readable medium of claim 13, wherein the programmable logic IC comprises a field programmable gate array (FPGA).

* * * * *